(12) United States Patent
Gondcharton et al.

(10) Patent No.: US 10,115,698 B2
(45) Date of Patent: Oct. 30, 2018

(54) METHOD FOR DIRECT ADHESION VIA LOW-ROUGHNESS METAL LAYERS

(71) Applicant: COMMISSARIAT A L'ENERGIE ATOMIQUE ET AUX ENERGIES ALTERNATIVES, Paris (FR)

(72) Inventors: Paul Gondcharton, Grenoble (FR); Lamine Benaissa, Massy (FR); Bruno Imbert, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 13 days.

(21) Appl. No.: 15/519,203

(22) PCT Filed: Oct. 14, 2015

(86) PCT No.: PCT/EP2015/073746
§ 371 (c)(1),
(2) Date: Apr. 14, 2017

(87) PCT Pub. No.: WO2016/059094
PCT Pub. Date: Apr. 21, 2016

(65) Prior Publication Data
US 2017/0236800 A1   Aug. 17, 2017

(30) Foreign Application Priority Data
Oct. 17, 2014 (FR) ..................... 14 60017

(51) Int. Cl.
*H01L 23/00* (2006.01)
(52) U.S. Cl.
CPC ............. *H01L 24/83* (2013.01); *H01L 24/27* (2013.01); *H01L 24/32* (2013.01);
(Continued)

(58) Field of Classification Search
CPC ................................. H01L 2224/278
See application file for complete search history.

(56) References Cited

U.S. PATENT DOCUMENTS

2012/0037918 A1* 2/2012 Miyazaki ............... H01L 24/05
257/76
2012/0100657 A1   4/2012 Di Cioccio et al.
(Continued)

FOREIGN PATENT DOCUMENTS

FR         2 947 481 A1    1/2011

OTHER PUBLICATIONS

International Search Report dated Mar. 15, 2016 in PCT/EP2015/073746 filed Oct. 14, 2015.
(Continued)

*Primary Examiner* — Mounir Amer
(74) *Attorney, Agent, or Firm* — Oblon, McClelland, Maier & Neustadt, L.L.P.

(57) ABSTRACT

A method for assembling a first substrate and a second substrate via metal adhesion layers, the method including: depositing, on a surface of each of the first and second substrates, a metal layer with a thickness controlled to limit surface roughness of each of the deposited metal layers to below a roughness threshold; exposing the metal layers deposited on the surface of the first and second substrates to air; directly adhering the first and second substrates by placing the deposited metal adhesion layers in contact, the surface roughness of the contacted layers being that obtained at an end of the depositing. The adhesion can be carried out in the air, at atmospheric pressure and at room temperature, without applying pressure to the assembly of the first and second substrates resulting from directly contacting the deposited metal adhesion layers.

13 Claims, 4 Drawing Sheets

(52) U.S. Cl.
CPC  *H01L 2224/278* (2013.01); *H01L 2224/2745* (2013.01); *H01L 2224/2918* (2013.01); *H01L 2224/29082* (2013.01); *H01L 2224/29124* (2013.01); *H01L 2224/29139* (2013.01); *H01L 2224/29144* (2013.01); *H01L 2224/29147* (2013.01); *H01L 2224/29166* (2013.01); *H01L 2224/32145* (2013.01); *H01L 2224/32225* (2013.01); *H01L 2224/32245* (2013.01); *H01L 2224/83054* (2013.01); *H01L 2224/83092* (2013.01); *H01L 2224/83193* (2013.01); *H01L 2224/83895* (2013.01); *H01L 2924/04941* (2013.01); *H01L 2924/04953* (2013.01); *H01L 2924/20102* (2013.01)

(56) References Cited

U.S. PATENT DOCUMENTS

| | | | | |
|---|---|---|---|---|
| 2012/0119224 | A1* | 5/2012 | Tai | H01L 21/02002 257/77 |
| 2012/0146499 | A1* | 6/2012 | Zhou | H05B 33/14 315/1 |
| 2015/0207026 | A1* | 7/2015 | Kim | H01L 33/0075 438/26 |
| 2017/0053892 | A1* | 2/2017 | Wimplinger | H01L 21/67092 |

OTHER PUBLICATIONS

French Search Report dated Sep. 23, 2015 in FR 1460017 filed Oct. 17, 2014.

Shigetou, Akitsu et al., "Modified Diffusion Bond Process for Chemical Mechanical Polishing (CMP)-Cu at 150° C. in Ambient Air," Electronic Components and Technology Conference, 2009, pp. 365-369.

Shimatsu, T. et al., "Atomic diffusion bonding of wafers with thin nanocrystalline metal films," J. Vac. Sci. Technol. B. Microelectron. Nanometer Struct., vol. 28, No. 4, 2010, pp. 706-714.

Higurashi, Eiji et al., "Low-Temperature Bonding of GaN on Si Using a Nonalloyed Metal Ohmic Contact Layer for GaN-Based Heterogeneous Devices," IEEE Journal of Quantum Electronics, IEEE Service Center, vol. 48, No. 2, 2012, XP011398510, pp. 182-186.

Okada, Hironao et al., "Room Temperature Vacuum Sealing Using Surfaced Activated Bonding with AU Thin Films," Transducers '05: The 13$^{th}$ International Conference on Solid-State Sensors, Actuators and Microsystems, Digest of Technical Papers, IEEE Operations Center, vol. 1, 2005, XP010828071, pp. 932-935.

Sadaka, Mariam et al., "Building blocks for wafer-level 3D integration," 2009, XP007911313, 6 pages, http://www.electroiq.com/index/display/semiconductors-article-display/5243540368/articles/solid-state-technology/volume-52/Issue_10/Features/Advanced_Packaging/Building_blocks_for_wafer-level_3D_integration.html.

Stognij, A.I. et al., "Preparation of Ultrathin Gold Films by Oxygen-Ion Sputtering and Their Optical Properties," Technical Physics, Nauka/Interperiodica, vol. 48, No. 6, 2003, XP019314296, pp. 745-748.

Park, Manseok et al., "Argon plasma treatment on Cu surface for Cu bonding in 3D integration and their characteristics," Applied Surface Science, vol. 324, 2015, pp. 168-173.

U.S. Appl. No. 14/893,396, filed Nov. 23, 2015, US 2016/0126215 A1, Bruno Imbert et al.

U.S. Appl. No. 14/901,027, filed Dec. 28, 2015, US 2016/0372362 A1, Thomas Signamarcheix et al.

U.S. Appl. No. 14/910,553, filed Feb. 5, 2016, US 2016/0189995 A1, Paul Gondcharton et al.

U.S. Appl. No. 15/028,640, filed Apr. 11, 2016, US 2016/0252411 A1, Lamine Benaissa et al.

U.S. Appl. No. 15/028,876, filed Apr. 12, 2016, US 2016/0251250 A1, Lamine Benaissa et al.

U.S. Appl. No. 15/028,836, filed Apr. 12, 2016, US 2016/0257597 A1, Lamine Benaissa et al.

U.S. Appl. No. 15/121,855, filed Aug. 26, 2016, US 2017/0025377 A1, Paul Gondcharton et al.

U.S. Appl. No. 15/321,418, filed Dec. 22, 2016, Lamine Benaissa et al.

U.S. Appl. No. 13/808,703, filed Jan. 7, 2013, US 2013/0111719 A1, Chrystel Deguet et al.

U.S. Appl. No. 15/340,377, filed Nov. 1, 2016, Hubert Moriceau et al.

* cited by examiner

METHOD FOR DIRECT ADHESION VIA LOW-ROUGHNESS METAL LAYERS

TECHNICAL FIELD

The field of the invention is that of assembling two substrates by direct bonding of metal layers, in particular for application to the manufacture of microelectronic devices.

STATE OF PRIOR ART

The three-dimensional integration of microelectronic devices is an interesting alternative to increase the performances thereof, which are restricted today by their two-dimensional integration. This technique consists in stacking in the third dimension levels of active components and connecting them using the TSV (Through Silicon Vias) technology which enables vias to be made through the stack. The bonding of different stack levels is a key step for this technique.

In other fields of microelectronics, the metal bonding is also used to enable the thermal budget applied to the components to be limited, for example in manufacturing power, photonic, photovoltaic, etc. components.

In all these applications, assembling silicon substrates by directly contacting thin metal layers (in particular copper layers, this material being mostly used in interconnections in microelectronics) is essential to control from low temperatures. Indeed, the use of thermal budgets can disturb the alignment or deteriorate active devices within the substrates. For all these reasons, it is attempted to achieve a high mechanical strength bonding from low temperatures.

Another issue relates to the manufacture of heterostructures by bonding substrates having different thermal expansion coefficients. For many applications indeed, for example solar components or radiofrequency components, introducing substrates of materials other than silicon is necessary (InP, GaAs, $LiNbO_3$, $LiTaO_5$, quartz, . . . ). Yet, current direct bonding techniques require the control of surface states prior to bonding and the supply of a thermal budget to enhance bonding and thus make possible a proper mechanical strength of such assemblies in post-bonding methods (such as mechanical thinning or Smart Cut™). With the addition of a thermal budget, the materials expand differently from each other (because of the difference in the thermal expansion coefficients of the different materials) which generates bi-axial stresses in the stack that can lead to cracking, or even cleaving of one of the substrates of the assembly. Therefore, it is attempted to ensure a bonding which is as robust as possible at assembly and subsequent use temperatures, that is temperatures typically between 20 and 50° C.

Different manufacturing pathways enable substrates to be assembled through direct bonding of thin metal layers. It is set forth herein that by direct bonding, it is intended the assembly of substrates covered with thin metal layers without using "polymer bond" type intermediate materials.

A first technique consists in supplying energy at the time of contacting the plates by heating and applying a uniaxial pressure on either side of the assembly. However, this technique generally requires temperatures higher than 250° C. and pressures in the order of one Megapascal to achieve high mechanical strength copper-copper bondings. However, by the use of this technique, the advantage of low bonding temperatures is lost since 50° C. is exceeded (upper temperature limit for the method imposed by some heterostructures). The method parameters used also depend on the metals to be assembled: refractory metals thus have to be bonded at higher temperatures and pressures than transition metals (because of the difference in mechanical properties of the asperities that make up their surface and their capacity to be plastically deformed).

Another technique allows atmospheric pressure bonding. It implements an ionic bombardment activation of the surfaces of the metal layers which is made under vacuum and assembling substrates at atmospheric pressure by directly contacting adsorbate layers formed on the metal layers and the thickness of which is restricted by exposure to controlled humidity oxygen gas. Besides vacuum environment, this technique has the drawback to require to make bonding at a temperature of 150° C., which is incompatible with some contemplated applications, in particular in making some heterostructures. The paper of Shigetou, A. and Suga, T., "Modified diffusion bond process for chemical mechanical polishing (CMP)-Cu at 150 C in ambient air", in *Electron. Compon. Technol. Conf.* 2009 ECTC 2009 59th 365-369 (2009) could for example be referred to.

Another technique allows a room temperature bonding to be made. It consists in directly contacting metal surfaces under ultra-vacuum immediately after depositing them without exposing them back to air between depositing and bonding. This technique enables substrates to be assembled from room temperature under compression but requires an ultra-vacuum bonding environment usable with difficulty in industry (long desorption time, use of titanium trap tertiary pumps, handling of substrates in the ultra-vacuum frame). The paper of Shimatsu, T. and Uomoto, M. "Atomic diffusion bonding of wafers with thin nanocrystalline metal films", *J. Vac. Sci. Technol. B Microelectron. Nanometer Struct.* 28, 706-714 (2010) could for example be referred to.

Finally, a last technique described in patent FR 2947481 B1 requires the activation of the surfaces by chemical mechanical polishing (CMP) and washing. This step enables in particular low roughness (RMS roughness lower than 1 nm) and hydrophilic (water drop angle between 0 and 20°) surfaces to be obtained. Thus, bonding can be made at ambient temperature, under atmospheric pressure in particular in air and without uniaxial pressure upon contacting the plates. This technique however requires a controlled CMP technique depending on the metals to be bonded. Furthermore, in accordance with the nature of the metal oxide formed during polishing and washing (called oxygen enriched crystalline layer in the patent), the mechanical strength of the final assembly at room temperature may not be sufficient to withstand post-bonding methods. In this case, making an annealing is necessary, and the upper limit of 50° C. for some applications is thereby exceeded.

Thus, it is understood that these techniques have drawbacks that it would be desirable to overcome: restrictive ultra-vacuum bonding atmosphere, thermal budgets necessary to enhance bonding energy and not compatible with the manufacture of heterostructures, pressure applied upon contacting the plates, material-sensitive polishing methods.

DISCLOSURE OF THE INVENTION

The invention aims at meeting this object and to this end, provides a method for assembling a first substrate and a second substrate via metal bonding layers, comprising the steps of:

depositing, onto the surface of each of the first and second substrates, a metal layer with a controlled thickness to limit the surface roughness of each of the metal layers deposited below a roughness threshold;

exposing the metal layers deposited onto the surface of the first and second substrates to the air;

directly bonding the first and second substrates by contacting the deposited metal bonding layers, the surface roughness of the contacted layers being that obtained at the end of the depositing step.

Some preferred but non-limiting aspects of the method are the following ones:

the bonding step is implemented after a maximum air exposition time of the deposited metal layers following said air exposition lower than 30 minutes, preferably lower than 20 minutes;

the bonding step is made at a temperature lower than 50° C., preferably at room temperature, for example between 10° C. and 30° C.;

the bonding step is made at atmospheric pressure;

the bonding step is made in air;

the bonding step is made without applying pressure to the assembly of the first and second substrates resulting from contacting the metal bonding layers;

it comprises, before depositing a metal layer onto the surface of the first substrate, a step of forming a superficial layer on said first substrate;

the superficial layer is a barrier layer to the diffusion of the material of the metal layer into the first substrate, for example a superficial layer of titanium nitride or tantalum nitride;

the superficial layer is a layer of a material chosen from dielectrics, nitrides or metals the surface roughness of which does not enable the first and second substrates to be directly bonded;

the first and second substrates have different thermal expansion coefficients;

the metal layers are deposited by physical vapour deposition;

the metal layers are copper layers with a controlled thickness to limit their surface roughness, as measured with an atomic force microscope scanning an area of 1*1 µm², below 1.0 nm RMS;

the metal layers are gold layers with a controlled thickness to limit their surface roughness, as measured with an atomic force microscope scanning an area of 1*1 µm², below 1.2 nm RMS;

it comprises, before bonding, forming, by implanting atomic species, an embrittling zone within the first substrate, and, following bonding, removing a portion of the first substrate by separating said first substrate at the embrittling zone.

BRIEF DESCRIPTION OF THE DRAWINGS

Further aspects, purposes, advantages and characteristics of the invention will better appear upon reading the following detailed description of preferred embodiments thereof, given by way of non-limiting example, and made in reference to the appended drawings in which.

DETAILED DISCLOSURE OF PARTICULAR EMBODIMENTS

Figure 1A:
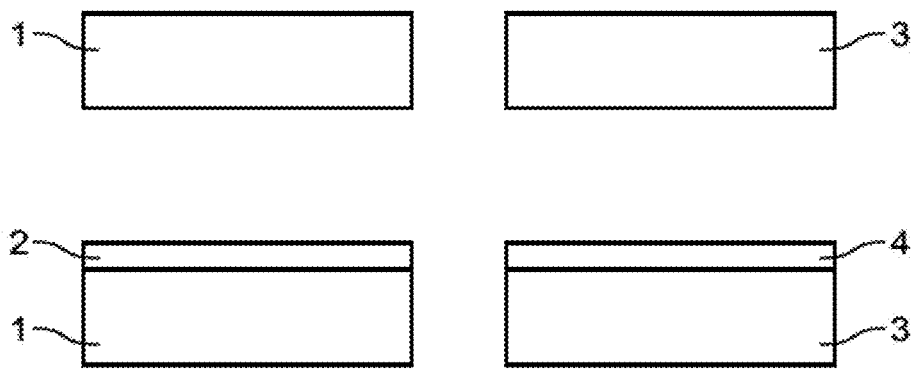
FIG. 1a-1c are schemes illustrating the steps of a possible embodiment of the method according to the invention.
Figure 1B:
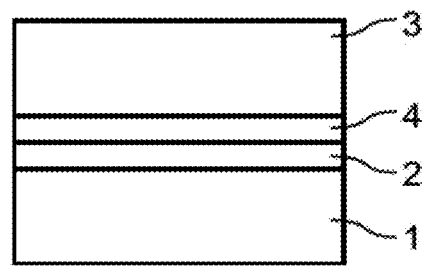
Figure 1C:
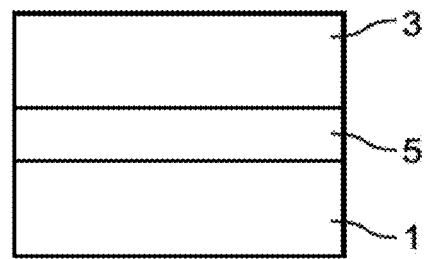

In reference to FIG. 1a to 1c, the invention relates to a method for assembling a first substrate 1 and a second substrate 3 via metal bonding layers 2, 4. The substrates 1, 3 are made of materials generally chosen from semi-conductor, metal or ceramic materials used in the microelectronic industry. The substrates are not necessarily of an identical nature, and could in particular have different thermal expansion coefficients at least in one of the orientations of the substrates, typically coefficients differing by at least 10% or 20% at room temperature. By way of illustrating examples, the first substrate can be a silicon substrate and the second substrate can be a quartz or lithium niobate substrate.

As illustrated in FIG. 1a, the method comprises a step of depositing, onto the surface of each of the first and second substrates 1, 3, a metal layer 2, 4, for example by Physical Vapour Deposition (PVD).

The metal layer 2, 4 deposited onto the surface of each of the substrates 1, 3 is for example an aluminium, gold, silver, titanium or copper layer.

In a possible embodiment, the method comprises, before depositing a metal layer onto the surface of one of the substrates, for example the first substrate, a step of forming a superficial layer on said substrate. The superficial layer is for example a metal layer or an oxide layer. The superficial layer can for example be a barrier layer to the diffusion of the material of the metal layer into the substrate, for example a titanium nitride or tantalum nitride superficial layer. The superficial layer can also be a layer of a material chosen from dielectrics, nitrides or metals the surface roughness of which does not enable the first and second substrates to be directly bonded.

Within the scope of the present invention, the deposited metal layers 2, 4 are each of a controlled thickness to limit the surface roughness of each of the deposited metal layers below a roughness threshold.

It is known that the higher the thickness of a deposited metal layer is the more the surface roughness of the metal layer increases. Thereby, depending on the surface roughness of the first and second substrates 1, 3, those skilled in the art are quite able to adapt the deposited metal thickness such that the surface roughness of the deposited metal layers remains below the roughness threshold. This requirement results in practice in depositing very thin metal layers 2, 4, for example with thicknesses lower than 100 nm.

Figure 2A:
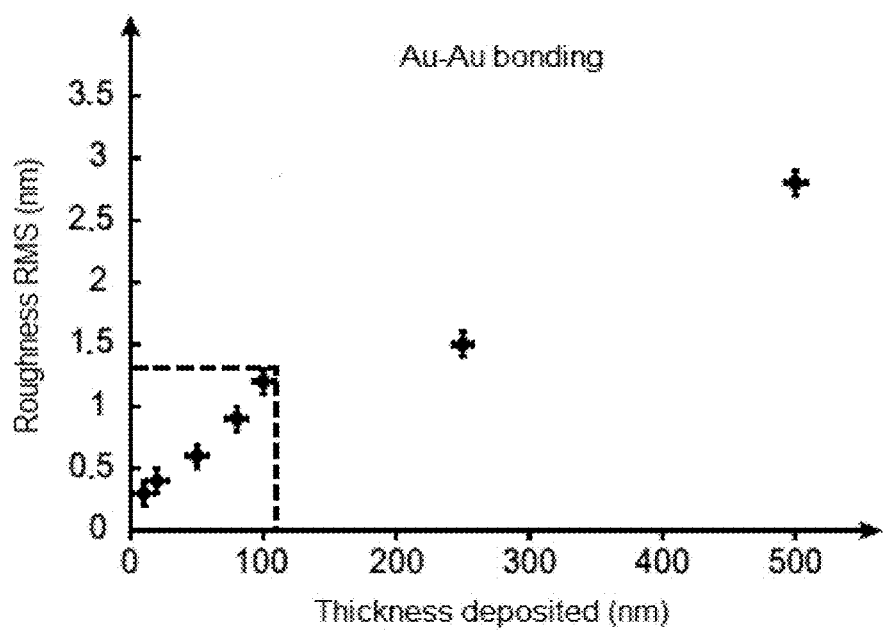
FIGS. 2a and 2b illustrate the surface roughness of metal layers, respectively of gold and copper, as a function of the thickness deposited onto a silicon substrate covered with a titanium nitride superficial layer.
Figure 2B:
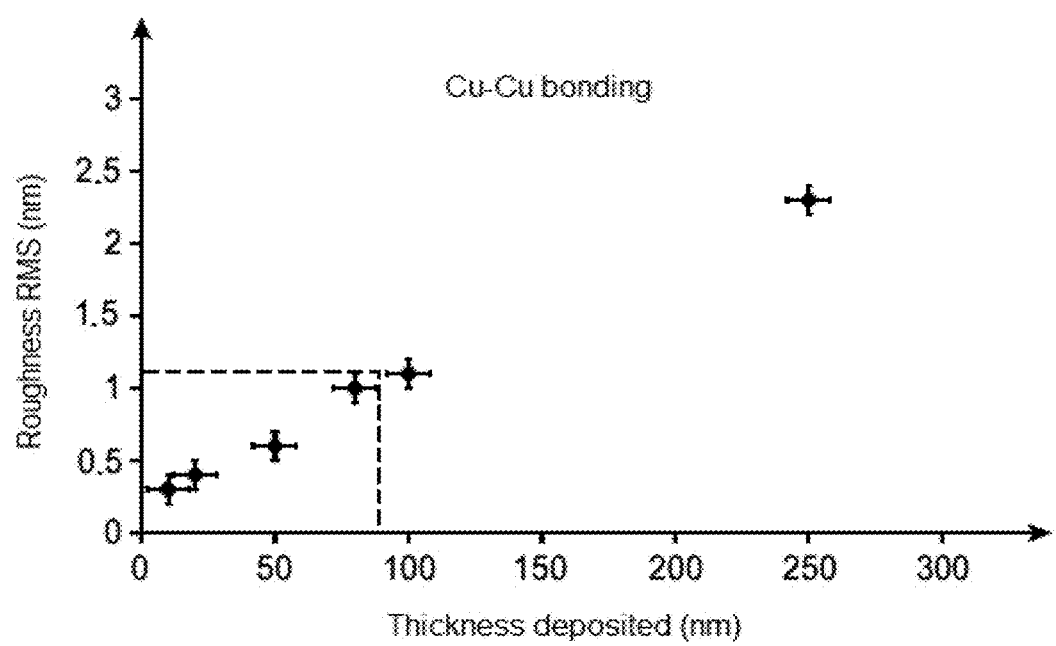

In FIGS. 2a and 2b, is represented the variation in the surface roughness, as measured with an atomic force microscope scanning an area of 1*1 µm², of metal layers of gold and copper respectively as a function of the thickness deposited onto a silicon substrate covered with a titanium nitride superficial layer with a thickness of 20 nm. On each of these Fig., the zone surrounded by the dashed line represents the couples of parameters compatible with the direct bonding according to the invention.

Thus, when the metal layers are copper layers, their thickness is preferably controlled to limit their surface roughness, as measured with an atomic force microscope scanning an area of 1*1 µm², below 1.0 nm RMS. This corresponds, for a continuous metal layer (full plate), to a surface roughness from peak to valley below about 10 nm.

In a similar way, when the metal layers are gold layers, their thickness is preferably controlled to limit their surface roughness, as measured with an atomic scanning microscope scanning an area of 1*1 µm², below 1.2 nm RMS. This corresponds, for a continuous metal layer (full plate), to a surface roughness from peak to valley below about 12 nm.

Returning to the description of the method according to the invention, this includes following the formation of the metal layers, a step of exposing the metal layers 2, 4 deposited onto the surface of the first and second substrates 1, 3 to air. This air exposition makes the method according to the invention much easier to implement from an industrial point of view than techniques requiring to ensure a vacuum environment or a protecting atmosphere against metal oxidation. This air exposition is directly made after forming the metal layers, that is without carrying out an intermediate technological step which would modify surface physico-chemical characteristics of the metal layers, in particular their roughness.

Then in reference to FIG. 1b, the method includes a step of bonding the first and second substrates 1, 3 by directly contacting the deposited metal bonding layers 2, 4 which surface roughness is limited by the depositing step. The surface roughness of the layers directly contacted thus directly comes from the depositing step, without requiring a CMP type polishing or any other operation that modifies the surface roughness. Thus, the method does not include a step modifying the surface roughness after the metal layers are formed, such as a CMP polishing step, to achieve bonding, the surface roughness of the directly contacted layers being that obtained at the end of the depositing step.

Within the scope of the present invention, the terms direct bonding and bonding by direct contact are equivalent.

This bonding step is implemented after a maximum air exposition time of the deposited metal layers following said air exposition which is preferably lower than 30 minutes, further preferably lower than 20 minutes. It is directly implemented after the air exposure step, that is without carrying out an intermediate technological step which would modify the surface physico-chemical characteristics of the metal layers, in particular their roughness.

The bonding step can in particular be made at a temperature lower than 50° C., in particular at room temperature, for example between 10° C. and 30° C. It can further be made at atmospheric pressure, in particular in air. It can also be made without applying pressure to the assembly of the first and second substrates resulting from contacting the metal bonding layers, the adhesion simply resulting from the substrates moving closer to each other.

At the end of the bonding step, and as schematically represented in FIG. 1c, no bonding interface is observed between the metal layers 2, 4 but finally there is a single metal layer 5 between the first and second substrates 1, 3. The bonding is thus reflected by a reconstruction of the bonding interface (that is a grain interpenetration through the bonding interface), wherein no continuous layer of metal oxide is detected at the interface.

Without wishing to be bound to any scientific theory, the following hypothesis for the mechanism enabling such a bonding to be made can be put forward:

Carrying out the deposition of the thin metal layer, the air exposure and the contact of the surfaces one after the other prevents or restricts the formation of a layer of metal oxide or a layer of surface-adsorbed hydrocarbons, which leaves the possibility to create metal bonds at room temperature. This hypothesis is in particular supported by measurements of high adhesion works indicating a change in the adhesion regimen. The attractive forces being involved are thus stronger than in the conventional case wherein van der Waals forces govern the adhesion.

The nature of both metals used in the method according to the invention is particular: these are ductile materials. Thus, in the adhesion mechanism, since repulsive forces are related to the mechanical response of the asperities, these materials will tend to be better deformed under the action of attractive forces. The combined action of this easier deformation and stronger forces involved thus leads to further extend the roughness limit compatible with the direct bonding of these surfaces.

Beside making it possible to perform bonding requiring no ultra-vacuum atmosphere, no application of a thermal budget, no pressure application, no polishing, another interest of the invention relates to the assembly of superficial layers which have a roughness too high to enable them to be directly bonded.

Figure 3A:
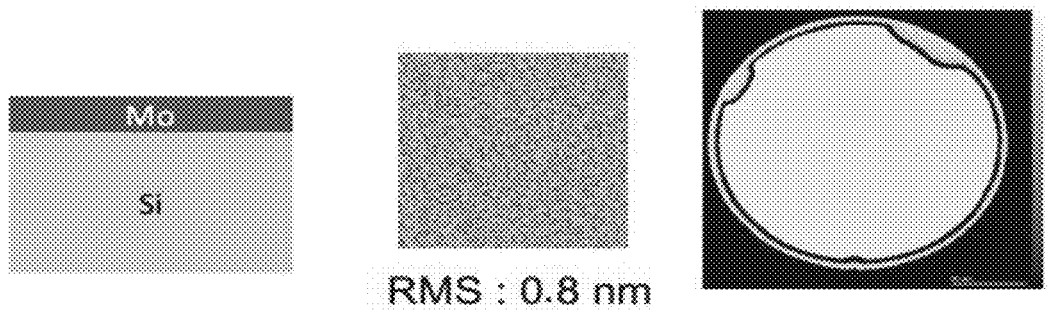
FIGS. 3a and 3b illustrate bonding silicon substrates by directly contacting molybdenum superficial layers and by directly contacting gold metal layers deposited onto such molybdenum layers.

By way of example, molybdenum superficial layers deposited onto Si substrates and the surface roughness of which of 0.8 nm RMS is too high to enable them to be assembled by direct contact as appears from FIG. 3a are considered. The bonding quality is evaluated by scanning acoustic microscopy: the zones with the brightest contrast are not bonded whereas the zones with the darkest contrast are. On the other hand, by depositing a fine gold layer with a 10 nm thickness onto a molybdenum layer, a surface roughness of 0.9 nm RMS lower than the roughness threshold of 1.2 nm RMS exemplified above is ensured, as well as a direct bonding resulting in a perfect assembly as appears from FIG. 3b.

Figure 3B:
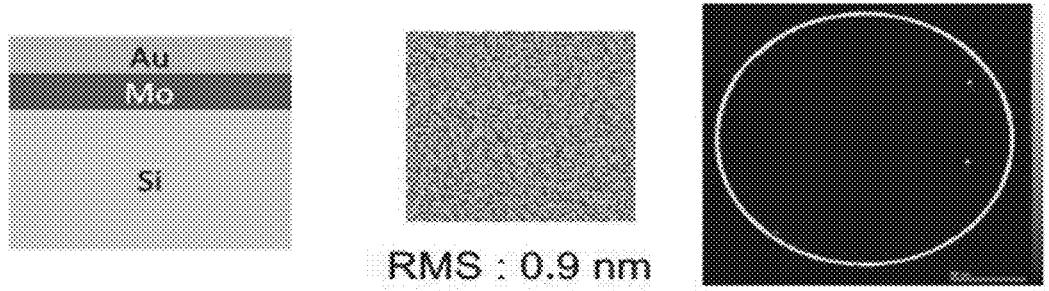
Figure 4:
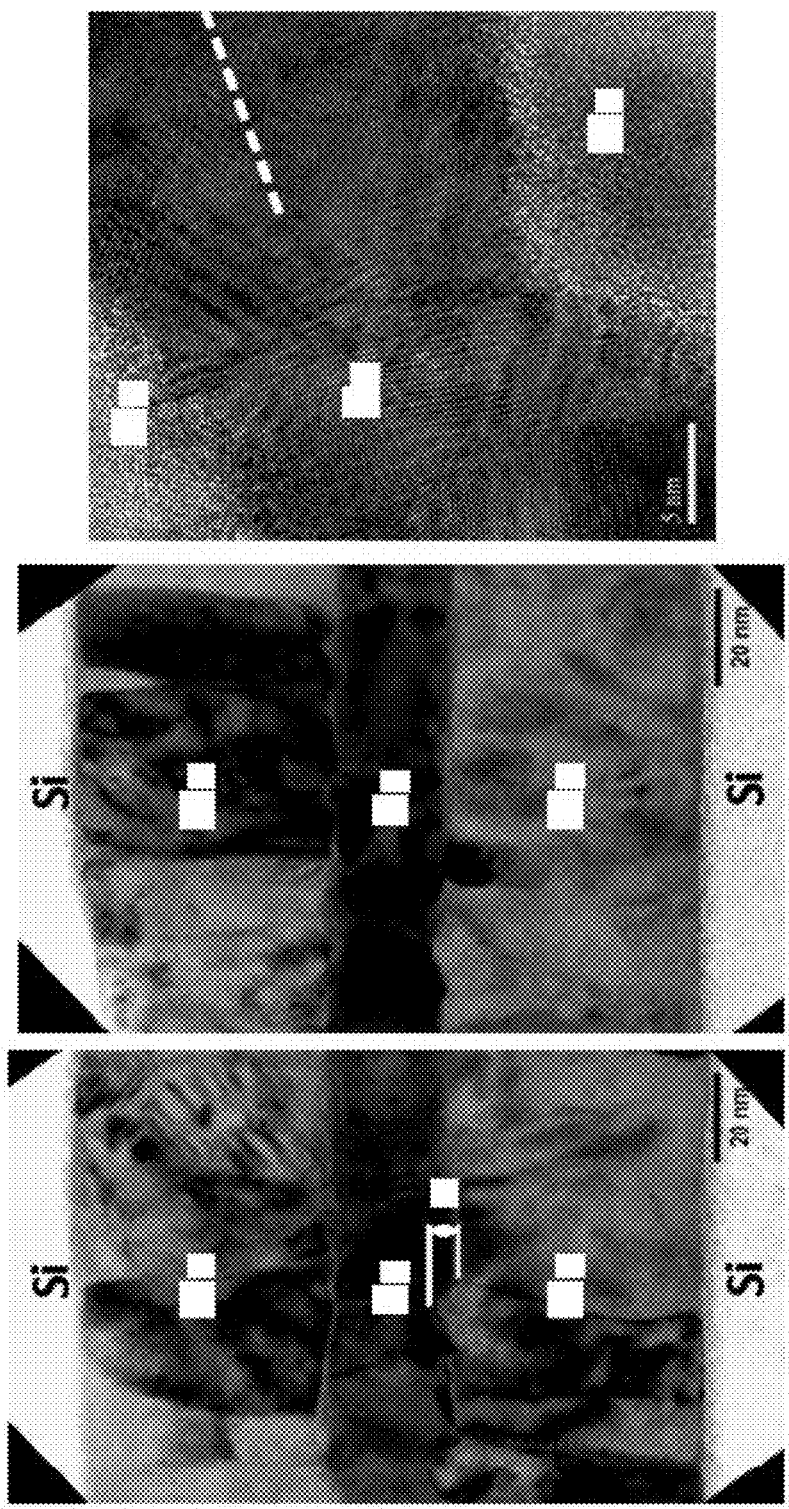
FIG. 4 illustrates bonding phenomena during and after directly contacting the gold metal layers of FIG. 3b.

In order to investigate phenomena after direct bonding of the structure of FIG. 3b, TEM (Transmission Electron Microscopy) cross-sections have been made and observed on the bonding of the Si—Mo—Au∥Au—Mo—Si structure. The left cross-section in FIG. 4 illustrates the structure immediately after contacting, reference RI indicating the initial roughness of the molybdenum layer. The centre cross-section and that on the right (where the dashed line is positioned at the original interface) of FIG. 4 illustrate the complete reconstruction of the gold layers and the disappearance of the bonding interface at room temperature. Since the gold surfaces have neither oxides nor hydrocarbons, they have made a real "atomic zip" of both surfaces. Finally, the ductility of the gold layers enabled Mo surfaces showing very high roughnesses to be bonded at the head of grains (in particular due to the columnar type Mo growth).

In a possible embodiment of the invention, the method comprises following bonding, a step of removing a portion of the first substrate. This removal can be made by mechanical and/or chemical thinning, or even by separating the first substrate at a previously embrittled zone, for example by implementing an ionic implantation. Thus, the method according to the invention can comprise, prior to bonding the substrates, forming by implanting atomic species an embrittling zone within the first substrate, and thinning, after bonding, the first substrate by separating said first substrate at the embrittling zone. By implementing in this way the Smart Cut™ technology within the scope of the method according to the invention, the transfer of a layer onto another substrate can be made, in particular in spite of different thermal expansion coefficients.

The invention claimed is:

1. A method for assembling a first substrate and a second substrate via metal bonding layers, comprising: depositing, onto a surface of each of the first and second substrates, a metal layer having a thickness which is controlled to limit surface roughness of the metal layer below a roughness threshold; exposing the metal layers to air; contacting the metal layers after the metal layers have been exposed to air, the surface roughness of the contacted metal layers being that obtained at an end of the depositing, and directly bonding the first and second substrates through the contacted metal layers; wherein the bonding is made without applying physical pressure to the assembly of the first and second substrates resulting from contacting the metal bonding layers.

2. The method according to claim 1, wherein the contacting is implemented after a maximum time of exposition of the metal layers to the air less than 30 minutes.

3. The method according to claim 1, wherein the bonding is made at a temperature less than 50° C.

4. The method according to claim 1, wherein the bonding is made at atmospheric pressure.

5. The method according to claim 1, wherein the bonding is made in air.

6. The method according to claim 1, further comprising, before the depositing the metal layer onto the surface of the first substrate, forming a superficial layer on the first substrate.

7. The method according to claim 6, wherein the superficial layer is a barrier layer to diffusion of material of the metal layer into the first substrate.

8. The method according to claim 6, wherein the superficial layer is a layer of a material chosen from dielectrics, nitrides, or metals with surface roughness that does not enable the first and second substrates to be directly bonded.

9. The method according to claim 1, wherein the first and second substrates have different thermal expansion coefficients.

10. The method according to claim 1, wherein the metal layers are deposited by physical vapor deposition.

11. The method according to claim 1, wherein the metal layers are copper layers having a thickness which is controlled to limit their surface roughness, as measured with an atomic force microscope scanning an area of $1*1$ $\mu m^2$, below a roughness threshold of 1.0 nm RMS.

12. The method according to claim 1, wherein the metal layers are gold layers having a thickness which is controlled to limit their surface roughness, as measured with an atomic force microscope scanning an area of $1*1$ $\mu m^2$, below a roughness threshold of 1.2 nm RMS.

13. The method according to claim 1, further comprising, prior to the bonding, forming, by implanting atomic species, an embrittling zone within the first substrate and, following the bonding, removing a portion of the first substrate by separating the first substrate at the embrittling zone.

* * * * *